US012716958B2

(12) United States Patent
Tokarz et al.

(10) Patent No.: US 12,716,958 B2
(45) Date of Patent: Aug. 25, 2026

(54) VEHICLE GROUND CONNECTION DIAGNOSTIC

(71) Applicant: Aptiv Technologies AG, Schaffhausen (CH)

(72) Inventors: Krzysztof Tokarz, Dublin (IE); Wojciech Typrowicz, Dublin (IE); Janusz Debski, Dublin (IE)

(73) Assignee: Aptiv Technologies AG, Schaffhausen (CH)

( * ) Notice: Subject to any disclaimer, the term of this patent is extended or adjusted under 35 U.S.C. 154(b) by 262 days.

(21) Appl. No.: 18/355,227

(22) Filed: Jul. 19, 2023

(65) Prior Publication Data

US 2024/0027543 A1 Jan. 25, 2024

(30) Foreign Application Priority Data

Jul. 22, 2022 (EP) .................................... 22186545

(51) Int. Cl.
*G01R 31/52* (2020.01)
*G01R 31/00* (2006.01)

(52) U.S. Cl.
CPC ........... *G01R 31/52* (2020.01); *G01R 31/006* (2013.01)

(58) Field of Classification Search
CPC ...... G01R 31/52; G01R 31/58; G01R 31/006; G01R 31/005–008; G01R 31/08; G01R 31/36; G01R 31/007; G01R 27/18
See application file for complete search history.

(56) References Cited

U.S. PATENT DOCUMENTS 9,989,575 B2 * 6/2018 Du ............................ H04L 1/24
10,252,635 B2 4/2019 Burkman et al.
2004/0212371 A1 10/2004 Nomoto et al.
(Continued)

FOREIGN PATENT DOCUMENTS

CN 101141125 3/2008
CN 109557359 4/2019
(Continued)

OTHER PUBLICATIONS

"Extended European Search Report", EP Application No. 22186545.4, Feb. 20, 2023, 9 pages.

*Primary Examiner* — Lee E Rodak
*Assistant Examiner* — Demetrius R Pretlow
(74) *Attorney, Agent, or Firm* — Harness, Dickey & Pierce, P L C

(57) ABSTRACT

Vehicle ground connection diagnostic apparatus including voltage sensors for sensing the voltage on each of a plurality of ground connector lines, each providing a conduction path from an electronic control unit to ground. A plurality of switches is associated with a respective ground connector line and are controllable for switching between a connected state and a disconnected state. A controller controls the plurality of switches and identifies a ground connection fault based on identifying a change in sensed voltage characteristics on one of the ground connection lines between condition (a) when the switches are in a connected state and condition (b) when the switch for the one ground connection line is in the connected state and the or all switches for the or all other ground connection lines are in a disconnected state.

13 Claims, 2 Drawing Sheets

(56) References Cited

U.S. PATENT DOCUMENTS

| | | | | |
|---|---|---|---|---|
| 2007/0008666 | A1* | 1/2007 | Morita .................. | B60L 3/0069 361/42 |
| 2007/0176604 | A1 | 8/2007 | Morimoto | |
| 2010/0244849 | A1* | 9/2010 | Yano ...................... | G01R 31/52 324/510 |
| 2011/0080676 | A1* | 4/2011 | Yoshida ................. | G01R 31/52 361/30 |
| 2012/0109547 | A1 | 5/2012 | Willey et al. | |
| 2016/0240022 | A1* | 8/2016 | Tornare .................. | G01R 31/54 |
| 2019/0219621 | A1* | 7/2019 | Morimoto .............. | G01R 31/52 |
| 2020/0101847 | A1* | 4/2020 | Tofilescu ............... | G01R 1/203 |

FOREIGN PATENT DOCUMENTS

| | | | |
|---|---|---|---|
| CN | 113625021 | | 11/2021 |
| DE | 10019612 | | 10/2001 |
| EP | 2236343 | | 10/2010 |
| EP | 2390678 | | 11/2011 |
| JP | 2021156673 | A * | 10/2021 |
| WO | 2009020535 | | 2/2009 |
| WO | 2017008057 | | 1/2017 |

* cited by examiner

Figure 2

Vehicle

Vehicle ground connection diagnostic apparatus

ECU

VEHICLE GROUND CONNECTION DIAGNOSTIC

INCORPORATION BY REFERENCE

This application claims priority to European Patent Application No. EP22186545.4, filed Jul. 22, 2022, the disclosure of which is incorporated by reference in its entirety.

BACKGROUND

Modern automotive vehicles typically include electronic control units, such as a body control module (BCM), for controlling various equipment and functions within the vehicle. For safety and device protection reasons, it has become common to provide each electronic control unit with two or more main ground connections in order to provide redundancy in the event of a fault. For instance, the wire harness connection into the BCM may include two ground connection lines which each independently provide a conductive path to ground. However, in architectures where two or more ground connections are provided, it becomes more difficult to diagnose a fault. In particular, when a fault occurs, this is often not identifiable because the low normal operating current can be carried by the remaining ground connection. Consequently, there is no way to verify that the required secondary ground connection redundancy is maintained.

Accordingly, there remains a need to accurately verify the status of a plurality of ground connection lines.

SUMMARY

According to a first aspect, there is provided a vehicle ground connection diagnostic apparatus comprising: one or more voltage sensors for sensing the voltage on each of a plurality of ground connector lines, each ground connector line for providing a conduction path from an electronic control unit to ground; a plurality of switches each associated with a respective ground connector line and being controllable for switching between a connected state where the conduction path for the respective ground connector line connects the electronic control unit to ground and a disconnected state where the conduction path is disconnected from ground; and a controller configured to control the plurality of switches and for identifying a ground connection fault based on identifying a change in sensed voltage characteristics on one of the ground connection lines between condition (a) when the switches are in a connected state and condition (b) when the switch for the one ground connection line is in the connected state and the or all switches for the or all other ground connection lines are in a disconnected state.

In this way, by monitoring the voltage characteristics under the two different connected conditions, faults in each individual ground connection may be identified. For example, if the voltage characteristics change on one line when the other ground connection lines are disconnected, a fault can be identified. In this way, each ground connection line can be validated as functioning. At the same time, the number of wires in an associated wire harness may be reduced because the integrity of each ground connection line can be reliably validated.

In embodiments, the change in sensed voltage characteristics is determined based on comparing a sensed voltage on one of the plurality of ground connection lines under condition (a) with a sensed voltage on the one ground connection line under condition (b). In this way, a change in the voltage level may be used as the characteristic for identifying a fault.

In embodiments, the controller is configured to identify a ground connection fault on the one of the plurality of ground connection lines when sensed voltage is higher under condition (b) than under condition (a). In this way, a fault may be identified by the potential difference relative to a reference level, such as ground, increasing because the respective ground connection line is no longer grounded.

In embodiments, the controller is configured to identify a ground connection fault on each of the plurality of ground connection lines by comparing the voltage on said line under condition (a) and condition (b). In this way, each ground connection line may be tested sequentially.

In embodiments, the controller is configured to perform a diagnostic sequence in which: all the plurality of switches are switched to a connected state and the voltages on each of the plurality of ground connector lines are recorded; and all the plurality of switches are first switched to a disconnected state and each switch is switched in turn to a connected state and the voltage on the respective ground connector line for said switch is recorded. In this way, the controller may implement an automatic testing cycle to validate each of the plurality of ground connections in turn.

In embodiments, the controller is configured to perform the diagnostic sequence on start-up of the electronic control unit. In this way, the ground connection status may be validated each time the electronic control unit is operated, such as on startup of the vehicle. In embodiments, the diagnostic sequence may be triggered by a diagnostic request, for instance, from a vehicle service computer operated by a vehicle mechanic or engineer.

In embodiments, the one or more voltage sensors comprise a plurality of analog to digital converters, ADC, each ADC being for sensing the voltage on a respective one of the plurality of ground connector lines. In this way, the voltage level may be digitized for storage and comparison to subsequent readings. For example, reference characteristics may be stored and compared to future characteristics over time.

In embodiments, the plurality of switches comprise a plurality of MOSFETs, each provided in line with the respective ground connector line. In this way, high-speed switching may be provided with low current leakage.

In embodiments, the controller is configured to output a trigger signal upon identifying a ground connection fault. In this way, the controller may implement actions in response to the detection of a fault. For instance, the fault may be recorded in a diagnostic log, or a repair alert or command prompt may be issued.

In embodiments, the trigger signal is for controlling a functionality of the vehicle. In this way, the controller may effect a vehicle response. For instance, upon detection of a serious fault, the vehicle's speed may be limited, or autonomous driving functionality may be engaged or disengaged. Equally, in embodiments, the trigger signal may trigger the vehicle to engage fault response functionality, for example by causing the vehicle to transmit a fault notification signal to a control centre, which in turn may schedule a repair operation for the vehicle. In such arrangements, the control centre may manage fault notifications from a number of vehicles connected over a cellular network and schedule repairs as needed.

According to a second aspect, there is provided a vehicle ground connection diagnostic method comprising: sensing the voltage on each of a plurality of ground connector lines, each ground connector line for providing a conduction path from an electronic control unit to ground; controlling the switching on a plurality of switches each associated with a respective ground connector line and being switchable between a connected state where the conduction path for the respective ground connector line connects the electronic control unit to ground and a disconnected state where the conduction path is disconnected from ground; and identifying a ground connection fault based on identifying a change in sensed voltage characteristics on one of the ground connection lines between condition (a) when the or all other switches are switch to a connected state and condition (b) when the switch for the one ground connection line is switched to the connected state and the or all switches for the or all other ground connection lines are switched to a disconnected state. In this way, a method for identifying faults in each individual ground connection may be provided by monitoring the voltage characteristics under different connected conditions.

In embodiments, the step of identifying a change in sensed voltage characteristics includes comparing a sensed voltage on one of the plurality of ground connection lines under condition (a) with a sensed voltage on the one ground connection line under condition (b). In this way, a change in the voltage level may be used as the characteristic for identifying a fault.

In embodiments, the steps of controlling the switching and identifying a ground connection fault includes performing a diagnostic sequence in which: all the plurality of switches are switched to a connected state and the voltages on each of the plurality of ground connector lines are recorded; and all the plurality of switches are first switched to a disconnected state and each switch is in turn switched to a connected state while the voltage on the respective ground connector line for said switch is recorded. In this way, an automatic testing cycle may be implemented for validating each of the plurality of ground connections in turn.

In embodiments, the step of outputting a trigger signal upon identifying a ground connection fault.

According to a third aspect, there is provided a non-transient computer readable medium comprising instructions, which when executed by one or more processors controlling a vehicle ground connection diagnostic apparatus performs the above method. According to a fourth aspect, there is provided a computer software product comprising instructions, which when executed by one or more processors controlling a vehicle ground connection diagnostic apparatus performs the above method. In this way, software may be provided for implementing the above method.

According to a fifth aspect, there is provided a vehicle including: a vehicle ground connection diagnostic apparatus according to the above; and an electronic control unit configured to process the fault diagnostic signal generated by the diagnostic apparatus.

BRIEF DESCRIPTION OF THE DRAWINGS

An Illustrative embodiment will now be described with reference to the accompanying drawing.

Figure 2:
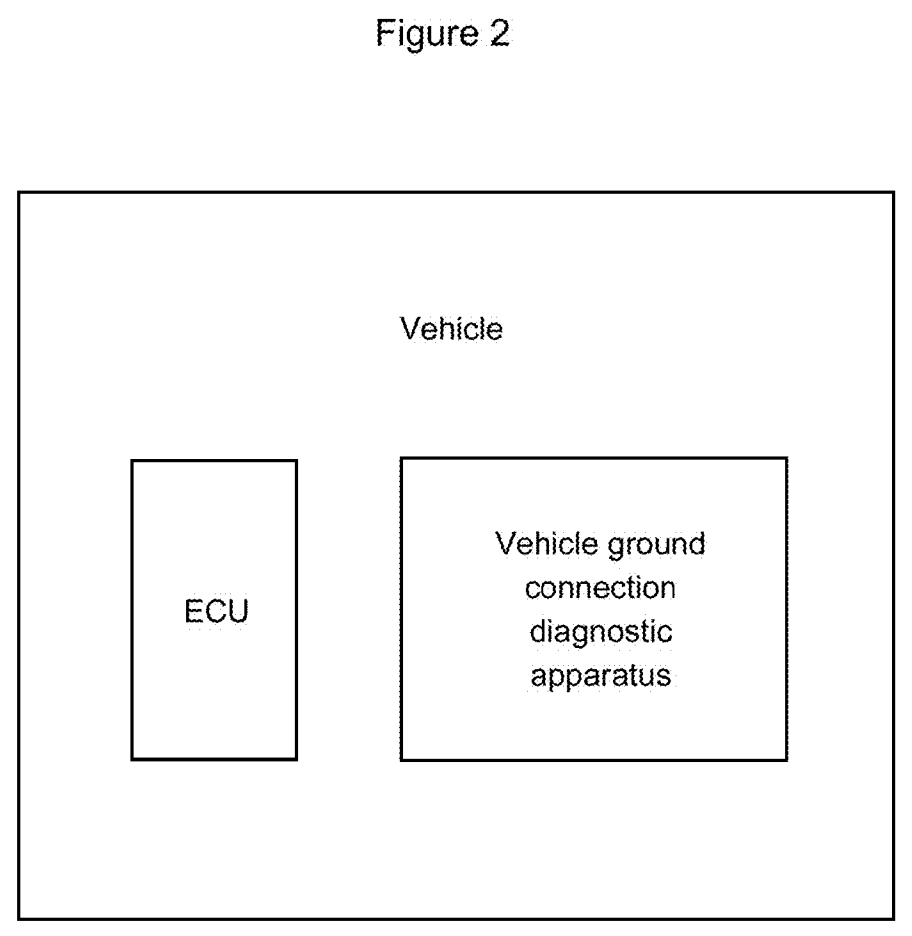

FIG. 2 shows a vehicle ground connection diagnostic apparatus and an electronic control unit ("ECU") according to an illustrative embodiment.

DETAILED DESCRIPTION

Figure 1:
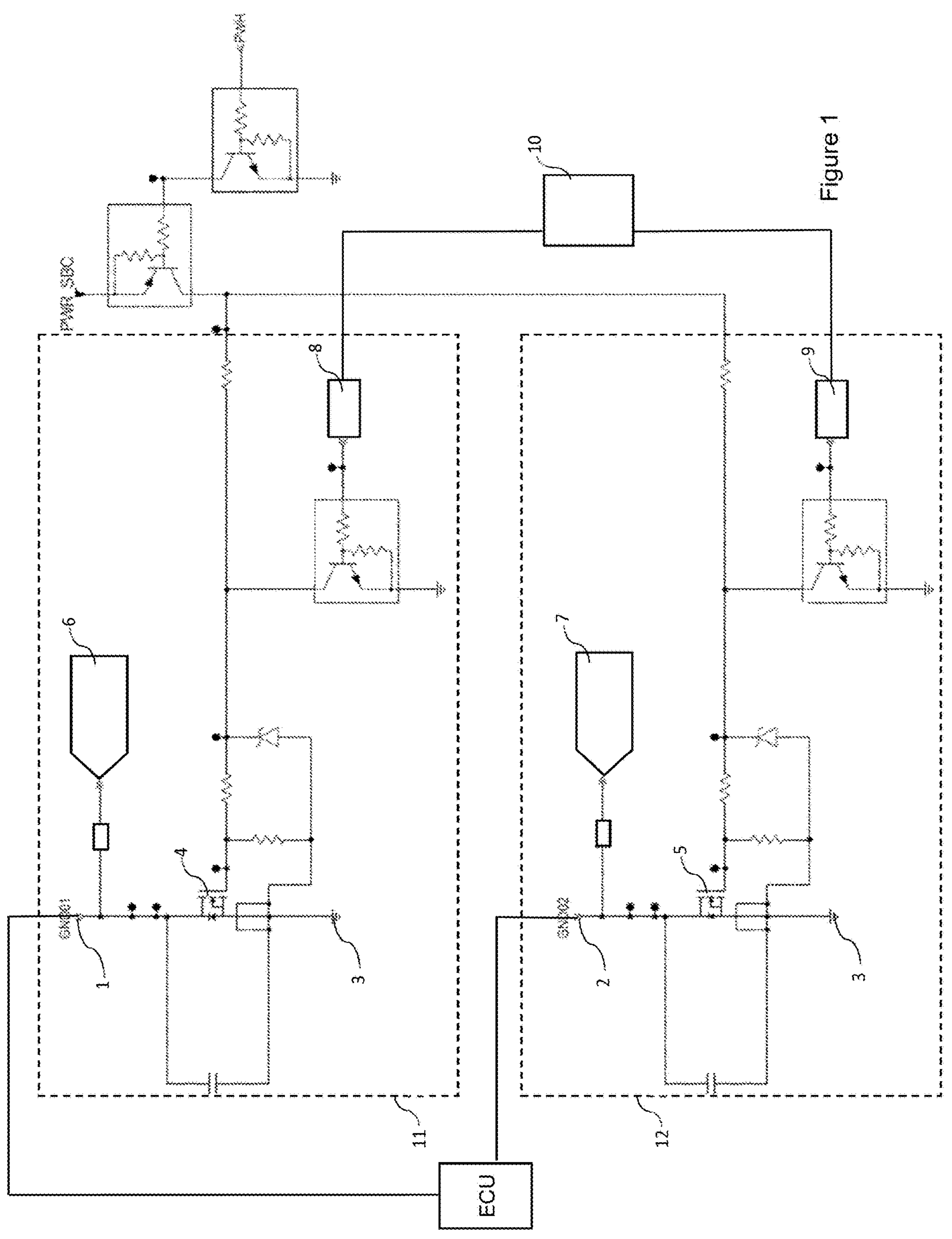
FIG. 1 shows a ground connection diagnostic circuit according to an illustrative embodiment.

The present disclosure relates to a vehicle ground connection diagnostic apparatus, a ground connection diagnostic method, and software for controlling a vehicle ground connection diagnostic apparatus. The present disclosure is particularly relevant to vehicle ground connection diagnostic systems for electronic control units having two or more ground connections.

A ground connection diagnostic circuit according to an illustrative embodiment is shown in the Figure. The circuit includes a first ground connection section 11 and a second ground connection section 12. Each section comprises a respective ground connection line 1 and 2, with each providing a separate current pathway from a vehicle wire harness to ground 3. As such, a body controller unit or other electronic control unit may be connected to ground 3 through the wire harness.

Each ground connection section 11, 12 includes a microcontroller Analog to Digital Converter (uC ADC) 6, 7, for measuring a voltage level on the respective ground connection line 1, 2. At the same time, respective MOSFETs are provided in line with the ground connection lines 1, 2 for switchably disconnecting their conduction path to ground 3. The gate of the first and second MOSFET transistors 4, 5 is controlled by the first and second diagnostic inputs 8, 9, respectively, which in turn are controlled by the controller 10.

In a normal operating mode, both the first and second MOSFET transistors 4, 5 are closed, as the applied PWH signal is in a high state. In this condition, the first and second ground connection lines 1, 2 are each connected to the ground 3.

When a diagnostic test is initiated, the controller 10 implements a diagnostic test sequence. In this embodiment, the controller firstly reads the voltage levels on each of the first and second ground connection lines 1, 2 using the first and second uC ADCs 6, 7. These values are recorded by the controller in a memory and are used as a baseline for subsequent comparison. The first and second ground connection lines 1, 2 are then tested individually in turn.

In this connection, to test the first ground connection line 1, the second diagnostic input 9 is set to a high state to connect the PWH signal to ground 3, which in turn sets the gate on the second MOSFET 5 to low for disconnecting the second ground connection line 2. In this state, the controller 10 then reads the voltage signals generated by the first uC ADC 6. If voltage value is substantially the same as the previously determined baseline for the first ground connection line 1, the controller 10 determines that this current path to ground is validated and correct. If the voltage value is higher, then the controller 10 determines that the first ground connection line 1 is broken and a fault alert is triggered. The fault alert may be stored in a diagnostic log for subsequent analysis, for instance during vehicle servicing. In other embodiments, the fault alert may trigger the control of functionality of the vehicle, such as limiting its speed, changing the autonomous driving mode, or prompting the transmission of a fault notification a central control centre to schedule a repair.

After the first harness ground connection line 1 has been tested, the second harness ground connection line 2 is tested. The controller 10 sets the second diagnostic input 9 to a low state to reconnect second harness ground connection line 2, and then sets the first diagnostic input 8 to a high state so as to set the gate on the first MOSFET 4 low for disconnecting the first harness ground connection line 1. In this state, the controller 10 then reads the voltage signals generated by the second uC ADC 7. If the voltage value is substantially the same as the previously determined baseline for the second ground connection line 1, the controller 10 determines that this current path to ground is validated and correct. If voltage value is higher, then the controller 10 determines that the second ground connection line 2 is broken and a fault alert is triggered. Again, the fault alert may be stored in a diagnostic log for subsequent analysis, for instance during vehicle servicing.

The controller 10 may be configured to undertake a diagnostic testing sequence whenever the body control module is started-up or when otherwise triggered. For instance, a diagnostic scan may be initiated during vehicle servicing.

In this way, ground connection faults in each of a plurality of ground connection lines may be identified. As such, where an electronic control module is provided with a plurality of ground connections for safety reasons, the provision of this redundancy may be verified. In turn, this may allow the number of wires in an associated wire harness to be reduced because the integrity of each ground connection line can be reliably validated and hence additional back up connections are not needed.

It will be understood that the embodiment illustrated above show applications only for the purposes of illustration. In practice, embodiments may be applied to many different configurations, the detailed embodiments being straightforward for those skilled in the art to implement.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figure and terms discussed herein may be indicative of one or more items or terms, and thus reference may be made interchangeably to single or plural forms of the items and terms in this written description.

What is claimed is:

1. A vehicle ground connection diagnostic apparatus comprising:

one or more voltage sensors for sensing the voltage on each of a plurality of ground connector lines, each ground connector line for providing a conduction path from an electronic control unit to ground;

a plurality of switches in a connected state, the plurality of switches each being associated with a respective ground connector line and being controllable for switching from a connected state where the conduction path for the respective ground connector line connects the electronic control unit to ground to a disconnected state where the conduction path is disconnected from ground; and a controller configured to control the plurality of switches and for identifying a ground connection fault in each individual ground connection line based on identifying a change in sensed voltage characteristics on one of the ground connection lines between condition (a) when the switches are in a connected state and condition (b) when the switch for the one ground connection line is in the connected state and the or all switches for the or all other ground connection lines are in a disconnected state;

wherein the change in sensed voltage characteristics is determined based on comparing a sensed voltage on one of the plurality of ground connection lines under condition (a) with a sensed voltage on the one ground connection line under condition (b); and wherein the controller is configured to identify the ground connection fault on the one of the plurality of ground connection lines when the sensed voltage is higher under condition (b) than under condition (a).

2. A vehicle ground connection diagnostic apparatus according to claim 1, wherein the controller is configured to identify the ground connection fault on each of the plurality of ground connection lines by comparing the voltage on each of the plurality of ground connection lines under condition (a) and under condition (b).

3. A vehicle ground connection diagnostic apparatus according to claim 1, wherein the one or more voltage sensors comprise a plurality of analog to digital converters (ADC), each ADC configured to sense the voltage on a respective one of the plurality of ground connector lines.

4. A vehicle ground connection diagnostic apparatus according to claim 1, wherein the controller is configured to output a trigger signal upon identifying the ground connection fault.

5. A vehicle ground connection diagnostic apparatus according to claim 1, wherein the controller is configured to perform a diagnostic sequence in which:

all the plurality of switches are switched to a connected state and the voltages on each of the plurality of ground connector lines are recorded; and all the plurality of switches are first switched to a disconnected state and each switch is switched in turn to a connected state and the voltage on the respective ground connector line for the switch is recorded.

6. A vehicle ground connection diagnostic apparatus according to claim 5, wherein the controller is configured to perform the diagnostic sequence on start-up of the electronic control unit.

7. A vehicle ground connection diagnostic apparatus according to claim 4, wherein the trigger signal is for controlling a functionality of the vehicle.

8. A vehicle ground connection diagnostic method comprising:

sensing a voltage on each of a plurality of ground connector lines, each ground connector line for providing a conduction path from an electronic control unit to ground;

controlling switching on a plurality of switches in a connected state, the plurality of switches each being associated with a respective ground connector line and being switchable from a connected state where the conduction path for the respective ground connector line connects the electronic control unit to ground to a disconnected state where the conduction path is disconnected from ground; and identifying a ground connection fault in each individual ground connection line based on identifying a change in sensed voltage characteristics on one of the ground connection lines between condition (a) when the or all other switches are switch to a connected state and condition (b) when the switch for the one ground connection line is switched to the connected state and the or all switches for the or all other ground connection lines are switched to a disconnected state;

wherein identifying the change in the sensed voltage characteristics further comprises comparing a sensed voltage on one of the plurality of ground connection lines under condition (a) with a sensed voltage on the one ground connection line under condition (b); and wherein the controller is configured to identify the ground connection fault on the one of the plurality of ground connection lines when the sensed voltage is higher under condition (b) than under condition (a).

9. A vehicle ground connection method according to claim 8, wherein the steps of controlling the switching and identifying the ground connection fault comprise performing a diagnostic sequence in which:

all the plurality of switches are switched to a connected state and the voltages on each of the plurality of ground connector lines are recorded; and all the plurality of switches are first switched to a disconnected state and each switch is in turn switched to a connected state while the voltage on the respective ground connector line for the switch is recorded.

10. A vehicle ground connection method according to claim 8, wherein controlling the switching and identifying the ground connection fault further comprise performing a diagnostic sequence in which:

all the plurality of switches are switched to a connected state and the voltages on each of the plurality of ground connector lines are recorded; and all the plurality of switches are first switched to a disconnected state and each switch is in turn switched to a connected state while the voltage on the respective ground connector line for the switch is recorded.

11. A vehicle ground connection method according to claim 10, further comprising:

outputting a trigger signal upon identifying the ground connection fault.

12. A vehicle ground connection method according to claim 8, further comprising:

outputting a trigger signal upon identifying the ground connection fault.

13. A vehicle comprising:

an electronic control unit; and a vehicle ground connection diagnostic apparatus comprising:

one or more voltage sensors for sensing the voltage on each of a plurality of ground connector lines, each ground connector line for providing a conduction path from the electronic control unit to ground;

a plurality of switches in a connected state, the plurality of switches each being associated with a respective ground connector line and being controllable for switching from a connected state where the conduction path for the respective ground connector line connects the electronic control unit to ground to a disconnected state where the conduction path is disconnected from ground; and a controller configured to control the plurality of switches and for identifying a ground connection fault in each individual ground connection line based on identifying a change in sensed voltage characteristics on one of the ground connection lines between condition (a) when the switches are in a connected state and condition (b) when the switch for the one ground connection line is in the connected state and the or all switches for the or all other ground connection lines are in a disconnected state;

wherein:

the change in sensed voltage characteristics is determined based on comparing a sensed voltage on one of the plurality of ground connection lines under condition (a) with a sensed voltage on the one ground connection line under condition (b);

the controller is configured to identify the ground connection fault on the one of the plurality of ground connection lines when the sensed voltage is higher under condition (b) than under condition (a); and the electronic control unit is configured to process a fault diagnostic signal generated by the vehicle ground connection diagnostic apparatus.

* * * * *